US012795977B2

(12) United States Patent
Zeng

(10) Patent No.: US 12,795,977 B2
(45) Date of Patent: Nov. 10, 2026

(54) ALGaN/GaN POWER HEMT DEVICE AND METHOD FOR MANUFACTURING THE SAME

(71) Applicant: CHINA RESOURCES MICROELECTRONICS (CHONGQING) CO., LTD., Chongqing (CN)

(72) Inventor: Hongan Zeng, Chongqing (CN)

(73) Assignee: CHINA RESOURCES MICROELECTRONICS (CHONGQING) CO., LTD., Chongqing (CN)

( * ) Notice: Subject to any disclaimer, the term of this patent is extended or adjusted under 35 U.S.C. 154(b) by 257 days.

(21) Appl. No.: 18/698,170

(22) PCT Filed: Dec. 2, 2022

(86) PCT No.: PCT/CN2022/136274
§ 371 (c)(1),
(2) Date: Apr. 3, 2024

(87) PCT Pub. No.: WO2023/098887
PCT Pub. Date: Jun. 8, 2023

(65) Prior Publication Data

US 2024/0405116 A1 Dec. 5, 2024

(30) Foreign Application Priority Data

Dec. 2, 2021 (CN) ......................... 202111460267.5

(51) Int. Cl.
*H10D 30/47* (2025.01)
*H10D 30/01* (2025.01)
(Continued)

(52) U.S. Cl.
CPC ......... *H10D 30/475* (2025.01); *H10D 30/015* (2025.01); *H10D 62/124* (2025.01);
(Continued)

(58) Field of Classification Search
CPC .. H10D 30/475; H10D 30/015; H10D 62/124; H10D 62/60; H10D 62/8503;
(Continued)

(56) References Cited

U.S. PATENT DOCUMENTS 10,177,239 B2 * 1/2019 Morancho ............ H10D 30/015
2009/0179227 A1 7/2009 Otake et al.
(Continued)

FOREIGN PATENT DOCUMENTS

CN 104425570 A 3/2015
CN 105097911 A 11/2015
(Continued)

OTHER PUBLICATIONS

Extended European Search Report received in corresponding Application No. EP 22900691.1, dated Jul. 14, 2025, 9 pages.
(Continued)

*Primary Examiner* — Mark W Tornow
(74) *Attorney, Agent, or Firm* — Dority & Manning, PA

(57) ABSTRACT

The present invention provides an AlGaN/GaN power HEMT device and a preparation method therefor. The device comprises: an n-type GaN substrate, a first p-type GaN layer, an AlGaN layer, a hole-injection-type PN junction layer and a gate structure, wherein the gate structure penetrates the hole-injection-type PN junction layer, the AlGaN layer and the first p-type GaN layer and stops in the n-type GaN substrate, and comprises a gate metal aluminum layer and a gate silicon dioxide layer; and the hole-injection-type PN junction layer comprises a second p-type GaN layer and a second n-type GaN layer, which are distributed in the
(Continued)

horizontal direction, and the second n-type GaN layer is located on the side close to the gate structure.

15 Claims, 7 Drawing Sheets

(51) Int. Cl.
*H10D 62/10* (2025.01)
*H10D 62/60* (2025.01)
*H10D 62/85* (2025.01)
*H10D 64/23* (2025.01)

(52) U.S. Cl.
CPC ......... *H10D 62/60* (2025.01); *H10D 62/8503* (2025.01); *H10D 64/252* (2025.01)

(58) Field of Classification Search
CPC .... H10D 64/252; H10D 30/477; H10D 64/62; H10D 30/0297; H10D 30/668; H10D 64/513; H10D 62/824; H10D 62/221; H10D 62/292; H10D 62/314
See application file for complete search history.

(56) References Cited

U.S. PATENT DOCUMENTS

| | | | | |
|---|---|---|---|---|
| 2015/0069405 | A1* | 3/2015 | Yoshioka | H10D 30/4755 438/172 |
| 2018/0358456 | A1* | 12/2018 | Iucolano | H10D 64/511 |
| 2021/0257216 | A1* | 8/2021 | Yasunishi | H10D 30/668 |
| 2021/0265494 | A1* | 8/2021 | Miyajima | H10D 30/475 |

FOREIGN PATENT DOCUMENTS

| | | | |
|---|---|---|---|
| CN | 105140270 | A | 12/2015 |
| CN | 208062059 | U | 11/2018 |
| CN | 110277445 | A | 9/2019 |
| CN | 113270492 | A | 8/2021 |
| JP | 2009-188041 | A | 8/2009 |
| JP | 2010-263127 | A | 11/2010 |
| JP | 2011-155221 | A | 8/2011 |
| JP | 2011-165777 | A | 8/2011 |
| JP | 2012-084739 | A | 4/2012 |
| JP | 2013172108 | A | 9/2013 |
| JP | 2015-056486 | A | 3/2015 |
| JP | 2021-125536 | A | 8/2021 |

OTHER PUBLICATIONS

PCT International Search Report and Written Opinion (with English translation) for corresponding PCT Application No. PCT/CN2022/136274, mailed Jan. 18, 2023, 9 pages.

Office Action (with English translation) received in corresponding Application No. CN 202111460267.5, dated Feb. 10, 2026, 16 pages.

Japanese Office Action (w/ English translation) in corresponding JP Application No. 2024-527536, dated Apr. 1, 2025, in 11 pgs.

Korean Office Action (w/ English translation) in corresponding KR Application No. 10-2024-7017823, dated Apr. 9, 2025, in 11 pgs.

Supplemental Search Report received in corresponding Application No. CN 2021114602675, dated Jul. 31, 2026, 3 pages.

* cited by examiner

ALGaN/GaN POWER HEMT DEVICE AND METHOD FOR MANUFACTURING THE SAME

CROSS-REFERENCE TO RELATED APPLICATION

This application is a 35 U.S.C. § 371 national application of international patent application PCT/CN2022/136274, entitled "AlGaN/GaN POWER HEMT DEVICE AND METHOD FOR MANUFACTURING THE SAME" and filed on Dec. 2, 2022, which claims priority to Chinese Patent Application No. 202111460267.5, filed in the Chinese Patent Office on Dec. 2, 2021, entitled "AlGaN/GaN POWER HEMT DEVICE AND METHOD FOR MANUFACTURING THE SAME", both of which are incorporated herein by reference in its their entireties.

TECHNICAL FIELD

The present disclosure relates to a field of semiconductor devices, and more particularly, to an AlGaN/GaN power HEMT device and a method for manufacturing the same.

BACKGROUND

Power semiconductor devices are widely used in power converters such as DC converters, frequency converters, rectifiers, and inverters. They have excellent power control performance and play an irreplaceable role in power systems, photovoltaic power generation systems, hybrid locomotives, and the like.

Currently, most power semiconductor devices have a structure such as a silicon-based diode, a power MOSFET transistor, and an Insulated Gate Bipolar Transistor (IGBT). As power semiconductor devices using Si materials gradually reach their theoretical limits, the speed of renewal of existing power semiconductor devices continues to slow down. At the present research level, it is difficult to further realize high frequency, high power density and miniaturization of the Si-based device.

A wide-band-gap semiconductor material represented by gallium nitride (GaN) has characteristics of high critical breakdown electric field, high saturated electron velocity, high electron density, high electron mobility, high thermal conductivity, and the like, and is a high-radiation-resistant semiconductor material suitable for high frequency, high voltage, high temperature, and high power. GaN devices are the most critical semiconductor devices in the new generation of radar and communication systems, and are also the main devices in the new generation of semiconductor lighting. High Electron Mobility Transistor (HEMT) is a heterojunction field effect transistor. The GaN HEMT has a two-dimensional electron gas (2DEG) concentration characteristic of the GaN device formed by the AlGaN/GaN heterojunction, so that a high current density and a high electron saturation drift speed can be achieved. Therefore, the GaN HEMT is suitable as a high-frequency switch.

However, conventional GaN devices still have a large space for improvement in performance such as breakdown voltage and withstand voltage. For example, the conventional U-shaped GaN MOS transistor has an electric field concentration phenomenon in the region of the bottom of the trench, which limits an increase in the breakdown voltage of the device. How to optimize the channel structure, change the electric field distribution near the trench gate structure, and alleviate the electric field concentration phenomenon is an urgent problem to be solved for optimizing the breakdown characteristics of GaN devices.

Therefore, it is necessary to propose a new AlGaN/GaN power HEMT device and a method of manufacturing the same to solve the above problems.

SUMMARY

In view of the above-described disadvantages of the prior art, it is an object of the present disclosure to provide an AlGaN/GaN power HEMT device and a method for manufacturing the same, for solving the problems in the prior art that a conventional U-shaped GaN MOS transistor has an electric field concentration phenomenon in a bottom region of a trench, which restricts an improvement a breakdown voltage of the device.

To achieve the above and other related objects, the present disclosure provides an AlGaN/GaN power HEMT device including:

- an n-type GaN substrate;
- a first p-type GaN layer formed above the n-type GaN substrate;
- an AlGaN layer formed above the first p-type GaN layer;
- a hole-injection type PN junction layer formed above the AlGaN layer;
- a gate structure passing through the hole-injection type PN junction layer, the AlGaN layer, and the first p-type GaN layer, and stopped in the n-type GaN substrate, the gate structure including a gate metal aluminum layer and a gate silicon dioxide layer formed on sidewalls of and below the gate metal aluminum layer; the hole-injection type PN junction layer including a second p-type GaN layer and a second n-type GaN layer distributed in a horizontal direction, the second n-type GaN layer being located at a side close to the gate structure.

As an alternative solution of the present disclosure, the n-type GaN substrate has a thickness in a range of 5-10 μm.

As an alternative solution of the present disclosure, a doping concentration the n-type GaN substrate is in a range of $1\times10^{15}$-$5\times10^{15}$ $cm^{-3}$.

As an alternative solution of the present disclosure, the first p-type GaN layer has a thickness in a range of 0.5-1.5 μm.

As an alternative solution of the present disclosure, a doping concentration of the first p-type GaN layer is in a range of $1\times10^{16}$-$1\lambda10^{17}$ $cm^{-3}$.

As an alternative solution of the present disclosure, the AlGaN layer has a thickness in a range of 0.05-0.15 μm.

As an alternative solution of the present disclosure, a doping concentration of the AlGaN layer is in a range of $2\times10^{18}$-$5\times10^{18}$ $cm^{-3}$.

As an alternative solution of the present disclosure, the hole-injection type PN junction layer has a thickness in a range of 0.5-1.5 μm.

As an alternative solution of the present disclosure, a doping concentration of the second p-type GaN layer is in a range of $1\times10^{17}$-$1\times10^{18}$ $cm^{-3}$.

As an alternative solution of the present disclosure, a doping concentration of the second n-type GaN layer is in a range of $1\times10^{18}$-$1\times10^{19}$ $cm^{-3}$.

As an alternative solution of the present disclosure, the gate metal aluminum layer has a thickness in a range of 0.5-5 μm.

As an alternative solution of the present disclosure, the gate silicon dioxide layer has a thickness in the range of 0.5-5 μm.

As an alternative solution of the present disclosure, the AlGaN/GaN power HEMT device further includes a first n-type GaN layer formed below the n-type GaN substrate, and the first n-type GaN layer is led out as a drain of the AlGaN/GaN power HEMT device.

As an alternative solution of the present disclosure, the first n-type GaN layer has a thickness in a range of 0.5-1.5 μm and a doping concentration of the first n-type GaN layer is in a range of $1\times10^{18}$-$5\times10^{18}$ $cm^{-3}$.

As an alternative solution of the present disclosure, the AlGaN/GaN power HEMT device further includes a source metal layer formed above the hole-injection type PN junction layer.

As an alternative solution of the present disclosure, the source metal layer has a thickness in a range of 0.05-0.15 μm.

As an alternative solution of the present disclosure, the source metal layer comprises a metal gold layer, and the metal gold layer is led out as a source of the AlGaN/GaN power HEMT device.

As an alternative solution of the present disclosure, the AlGaN/GaN power HEMT device further includes a metal aluminum layer formed above the hole-injection type PN junction layer, the metal aluminum layer and the metal gold layer are distributed in a horizontal direction, and the metal aluminum layer is located at a side close to the gate structure.

As an alternative solution of the present disclosure, the metal aluminum layer has a thickness in a range of 0.05-0.15 μm.

As an alternative solution of the present disclosure, an interface between the metal aluminum layer and the metal gold layer is located above the second n-type GaN layer.

The present disclosure further provides a method for manufacturing an AlGaN/GaN power HEMT device, including the steps of:

providing an n-type GaN substrate;

sequentially forming a first p-type GaN layer, an AlGaN layer, and a hole-injection type PN junction layer from bottom to top above the n-type GaN substrate;

forming a gate structure passing through the hole-injection type PN junction layer, the AlGaN layer, and the first p-type GaN layer, and stopped in the n-type GaN substrate, the gate structure including a gate metal aluminum layer and a gate silicon dioxide layer formed on sidewalls of and below the gate metal aluminum layer, the hole-injection type PN junction layer including a second p-type GaN layer and a second n-type GaN layer distributed in a horizontal direction, the second n-type GaN layer being located at a side close to the gate structure.

As an alternative solution of the present disclosure, the method for manufacturing the AlGaN/GaN power HEMT device further includes the step of forming a first n-type GaN layer below the n-type GaN substrate, the first n-type GaN layer being led out as a drain of the AlGaN/GaN-power HEMT device.

As an alternative solution of the present disclosure, the source metal layer includes a metal gold layer, the metal gold layer is led out as a source of the AlGaN/GaN power HEMT device.

As an alternative solution of the present disclosure, the method for manufacturing the AlGaN/GaN power HEMT device further includes the step of forming a metal aluminum layer above the hole-injection type PN junction layer.

As an alternative solution of the present disclosure, the metal aluminum layer and the metal gold layer are distributed in a horizontal direction, and the metal aluminum layer is located at a side close to the gate structure.

As an alternative solution of the present disclosure, an interface between the metal aluminum layer and the metal gold layer is located above the second n-type GaN layer.

As described above, the AlGaN/GaN power HEMT device provided by the present disclosure and the method for manufacturing the same have the following beneficial effects:

compared with a conventional U-type GaN MOS transistor, the AlGaN/GaN power HEMT device provided by the present disclosure introduces a novel structure design, in which a channel structure is designed in a longitudinal direction to change an electric field distribution in the vicinity of a trench gate structure, thereby effectively relieving electric field concentration phenomenon, and further improving breakdown voltage and withstand voltage of the HEMT device.

REFERENCE NUMERALS

Figure 1:
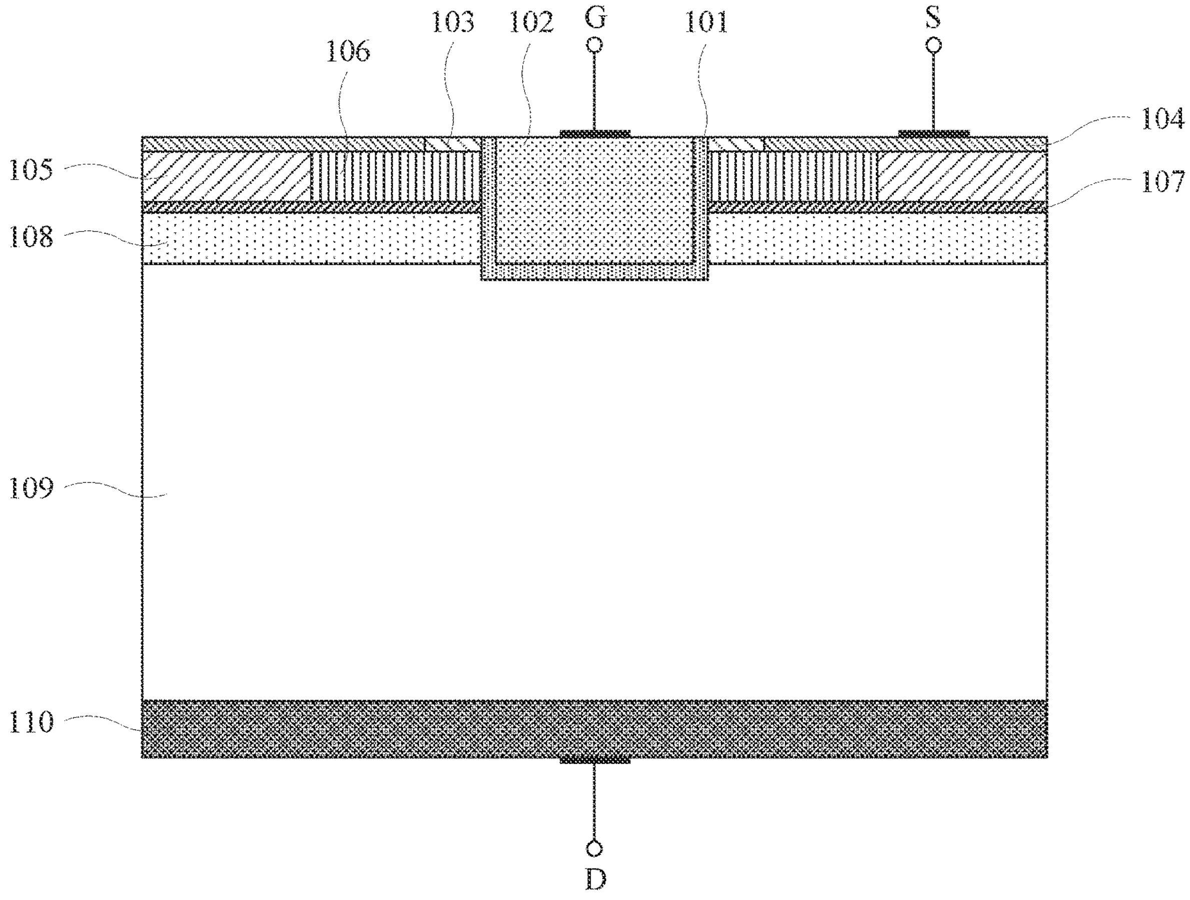
FIG. 1 is a schematic structural diagram of an AlGaN/GaN power HEMT device according to Embodiment 1 of the present disclosure.

101 gate silicon dioxide layer
102 gate metal aluminum layer
103 metal aluminum layer
104 metal gold layer
105 second p-type GaN layer
106 second n-type GaN layer
107 AlGaN layer
108 first p-type GaN layer
109 n-type GaN substrate
110 first n-type GaN layer
111 hole-injection type PN junction layer
112 gate structure
113 source metal layer
G gate
S source
D drain

DETAILED DESCRIPTION OF THE EMBODIMENTS

Further advantages and advantages of the present disclosure will become readily apparent to those skilled in the art from the disclosure of this specification, which is illustrated by specific examples. The disclosure may also be practiced or applied by other different embodiments, and various modifications or changes may be made in the details of the specification without departing from the spirit of the disclosure, based on different points of view and applications.

Please refer to FIGS. 1 to 8. It should be noted that the drawings provided in this embodiment illustrate, by way of illustration only, the basic idea of the present disclosure, and that the drawings show only the components associated with the present disclosure and not drawn in terms of the number, shape and size of the components in actual implementation, and that the form, number and proportion of the components in actual implementation may be varied at will, and that the layout of the components may be more complex.

Embodiment 1

Referring to FIGS. 1 to 4, the present embodiment provides an AlGaN/GaN power HEMT device, which includes:

- an n-type GaN substrate 109;
- a first p-type GaN layer 108 formed above the n-type GaN substrate 109;
- an AlGaN layer 107 formed above the first p-type GaN layer 108;
- a hole-injection type PN junction layer formed above the AlGaN layer 107;
- a gate structure passing through the hole-injection type PN junction layer, the AlGaN layer 107, and the first p-type GaN layer 108, and stopped in the n-type GaN substrate 109, the gate structure including a gate metal aluminum layer 102 and a gate silicon dioxide layer 101 formed on sidewalls of and below the gate metal aluminum layer 102;

The hole-injection type PN junction layer includes a second p-type GaN layer 105 and a second n-type GaN layer 106 distributed in a horizontal direction. The second n-type GaN layer 106 is located at a side close to the gate structure, and the gate metal aluminum layer 102 is led out as a gate G.

Compared with a conventional U-type GaN MOS transistor, the AlGaN/GaN power HEMT device provided by the present disclosure introduces a novel structure design, in which a channel structure is designed in a longitudinal direction to change an electric field distribution in the vicinity of a trench gate structure, thereby effectively relieving electric field concentration phenomenon, and further improving breakdown voltage and withstand voltage of the HEMT device.

As an example, the n-type GaN substrate 109 has a thickness in the range of 5 μm-10 μm (including the point value; in the description of the present disclosure, when referring to numerical ranges, unless otherwise specified, the point values are included), and a doping concentration thereof is in a range of $1\times10^{15}$ $cm^{-3}$-$5\times10^{15}$ $cm^{-3}$.

As an example, the first p-type GaN layer 108 has a thickness in a range of 0.5 μm-1.5 μm and a doping concentration thereof is in a range of $1\times10^{16}$-$1\times10^{17}$ $cm^{-3}$.

As an example, the AlGaN layer 107 has a thickness in the range of 0.05 μm-0.15 μm and a doping concentration thereof is in the range of $2\times10^{18}$-$5\times10^{18}$ $cm^{-3}$.

As an example, the hole-injection type PN junction layer has a thickness in the range of 0.5 μm-1.5 μm, a doping concentration of the second p-type GaN layer 105 is in a range of $1\times10^{17}$-$1\times10^{18}$ $cm^{-3}$, and a doping concentration of the second n-type GaN layer 106 is in a range of $1\times10^{18}$-$1\times10^{19}$ $cm^{-3}$.

As an example, the gate metal aluminum layer 102 has a thickness in a range of 0.5 μm-5 μm, and the gate silicon dioxide layer 101 has a thickness in a range of 0.5 μm-5 μm.

As an example, as shown in FIG. 1, the AlGaN/GaN power HEMT device further includes a first n-type GaN layer 110 formed below the n-type GaN substrate, the first n-type GaN layer 110 is led out as the drain D of the AGaN/GaN power HEMT device.

As an example, as shown in FIG. 1, the first n-type GaN layer 110 has a thickness in a range of 0.5 μm-1.5 μm and a doping concentration thereof is in a range of $1\times10^{18}$-$5\times10^{18}$ $cm^{-3}$.

As an example, as shown in FIG. 1, the AlGaN/GaN power HEMT device further includes a source metal layer formed above the hole-injection type PN junction layer. In a preferred example, the source metal layer has a thickness in a range of 0.05 μm-0.15 μm.

As an example, as shown in FIG. 1, the source metal layer includes a metal gold layer 104 that is led out as the source S of the AlGaN/GaN power HEMT device. As an example, as shown in FIG. 1, the AlGaN/GaN power HEMT device further includes a metal aluminum layer 103 formed above the hole-injection type PN junction layer, the metal aluminum layer 103 and the metal gold layer 104 are distributed in a horizontal direction, and the metal aluminum layer 103 is located at a side close to the gate structure. In a preferred example, the interface between the metal aluminum layer 103 and the metal gold layer 104 is located above the second n-type GaN layer 106.

As an example, in the present embodiment, the n-type GaN substrate 109 has a thickness of 8 μm and a doping concentration thereof is $2\times10^{15}$ $cm^{-3}$. Preferably, the first p-type GaN layer 108 has a thickness of 1 μm and a doping concentration thereof is $5\times10^{16}$ $cm^{-3}$. The AlGaN layer 107 has a thickness of 0.1 μm and a doping concentration thereof is $2\times10^{18}$ $cm^{-3}$. The hole-injection type PN junction layer has a thickness of 1 μm, that is, both the second p-type GaN layer 105 and the second n-type GaN layer 106 have the thickness of 1 μm. The doping concentration of the second p-type GaN layer 105 is $4\times10^{18}$ $cm^{-3}$, and the doping concentration of the second n-type GaN layer 106 is $2\times10^{18}$ $cm^{-3}$. The gate metal aluminum layer 102 has a thickness of 2.2 μm, and the gate silicon dioxide layer 101 has a thickness of 2.3 μm. The first n-type GaN layer 110 has a thickness of 1 μm and a doping concentration thereof is $2\times10^{18}$ $cm^{-3}$. The source metal layer has a thickness of 0.1 μm, that is, the metal gold layer 104 has a thickness of 0.1 μm. The metal aluminum layer 103 has a thickness of 0.1 μm.

The AlGaN/GaN power HEMT device provided in this embodiment is an enhanced GaN transistor having a maximum withstand voltage of up to 860 V. As shown in FIG. 1, the AlGaN/GaN power HEMT device has a vertical structure. Specifically, the first n-type GaN layer 110 is used as a substrate material, and the n-type GaN substrate 109 is used as a transition layer, and at the same time as a drift region, with a thickness of 8 μm. Then the second p-type GaN layer 108 and the AlGaN layer 107 are epitaxially grown on the n-type GaN substrate 109, so that a conductive two-dimensional electron gas (2DEG) can be generated from the formed AlGaN/GaN heterojunction, thereby improving electron mobility, effectively improving the breakdown voltage of the device, and further improving the output power of the device. The hole-injection type PN junction layer includes a second p-type GaN layer 105 and a second n-type GaN layer 106 distributed in a horizontal direction, which together form a hole-injection type PN junction. The gate structure is a trench gate including a gate metal aluminum layer 102 and a gate silicon dioxide layer 101 formed on sidewalls of and below the gate metal aluminum layer 102, the trench gate having a trench width of 2 μm and a trench depth of 2.3 μm.

In the conventional U-shaped GaN MOS transistor, there is an electric field concentration phenomenon in the bottom region of the trench, which restricts the improvement of the breakdown voltage of the device. However, the channel structure of the AlGaN/GaN power HEMT device in the present embodiment is a longitudinal structure, a structure of thick drift region is designed, and a two-dimensional electron gas is used to optimize the drift region, thereby changing the electric field distribution in the vicinity of the trench gate structure, alleviating the electric field concentration phenomenon, improving the breakdown characteristic of the U-shaped AlGaN/GaN power HEMT device, and improving an optimal value of the device.

Figure 2:
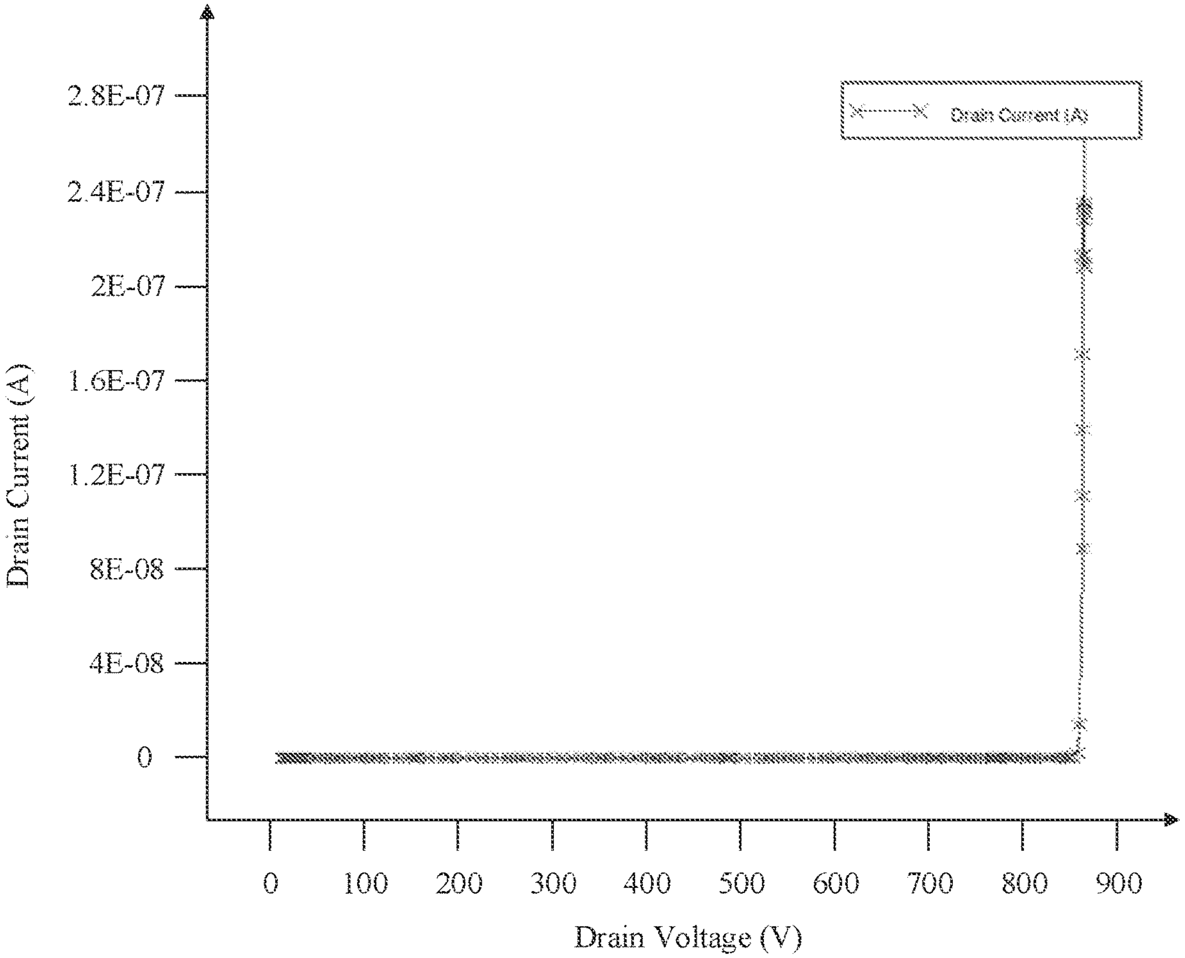
FIG. 2 is a graph showing a breakdown voltage characteristic curve of the AlGaN/GaN power HEMT device provided in Embodiment 1 of the present disclosure.

FIG. 2 is a graph showing a breakdown voltage characteristic curve of the AlGaN/GaN power HEMT device provided in the present embodiment. The AlGaN/GaN power HEMT device, as one of the power devices, needs to have a capability of withstanding high voltages in an off state. This capability can be measured in terms of breakdown voltage. For AlGaN/GaN power HEMT devices, the drain voltage corresponding to a device leakage current higher than 50 $mA/cm^2$ is generally referred to as the breakdown voltage. As shown in FIG. 2, in this embodiment, the breakdown voltage of the AlGaN/GaN power HEMT device is as high as 860 V, which far exceeds the breakdown voltage of the 400 V of the conventional U-shaped GaN MOS transistor. Further, when the breakdown voltage is 860V, the device will not be damaged, and the withstand voltage curve is repeatable.

Figure 3:
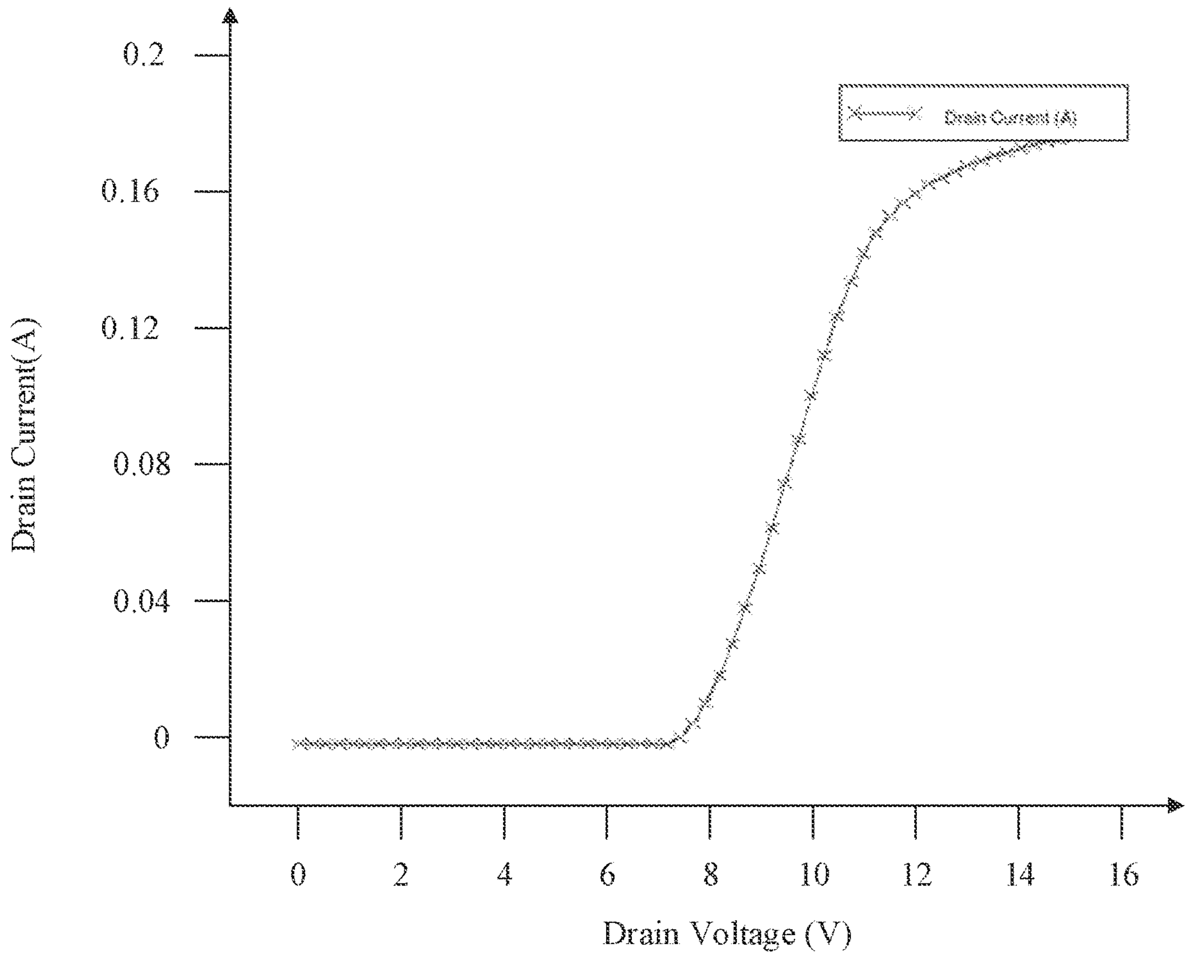
FIG. 3 is a graph of a transfer characteristic curve of an AlGaN/GaN power HEMT device provided in Embodiment 1 of the present disclosure.

FIG. 3 is a graph showing a transfer characteristic curve of the AlGaN/GaN power HEMT device provided in the present embodiment. The transfer characteristic curve of the device represents the relationship between the drain current $I_D$ and the gate voltage $V_{GS}$ at a fixed drain voltage $V_{DS}$, which may reflect the amplification capability of the device. FIG. 3 is a graph showing a transfer characteristic curve the AlGaN/GaN power HEMT device in the present embodiment in a linear coordinate, where the drain voltage $V_{DS}$=1 V. Important parameters such as a threshold voltage $V_{TH}$, a saturation current, a switching ratio $I_{ON}/I_{OFF}$, and a subthreshold swing S can be derived from the transfer characteristic curve in FIG. 3, where the threshold voltage $V_{TH}$ is 7.5V and the saturation current is 0.1/0.05/0.01 A. It can be seen that the above parameters are also superior to the conventional U-shaped GaN MOS transistor.

Figure 4:
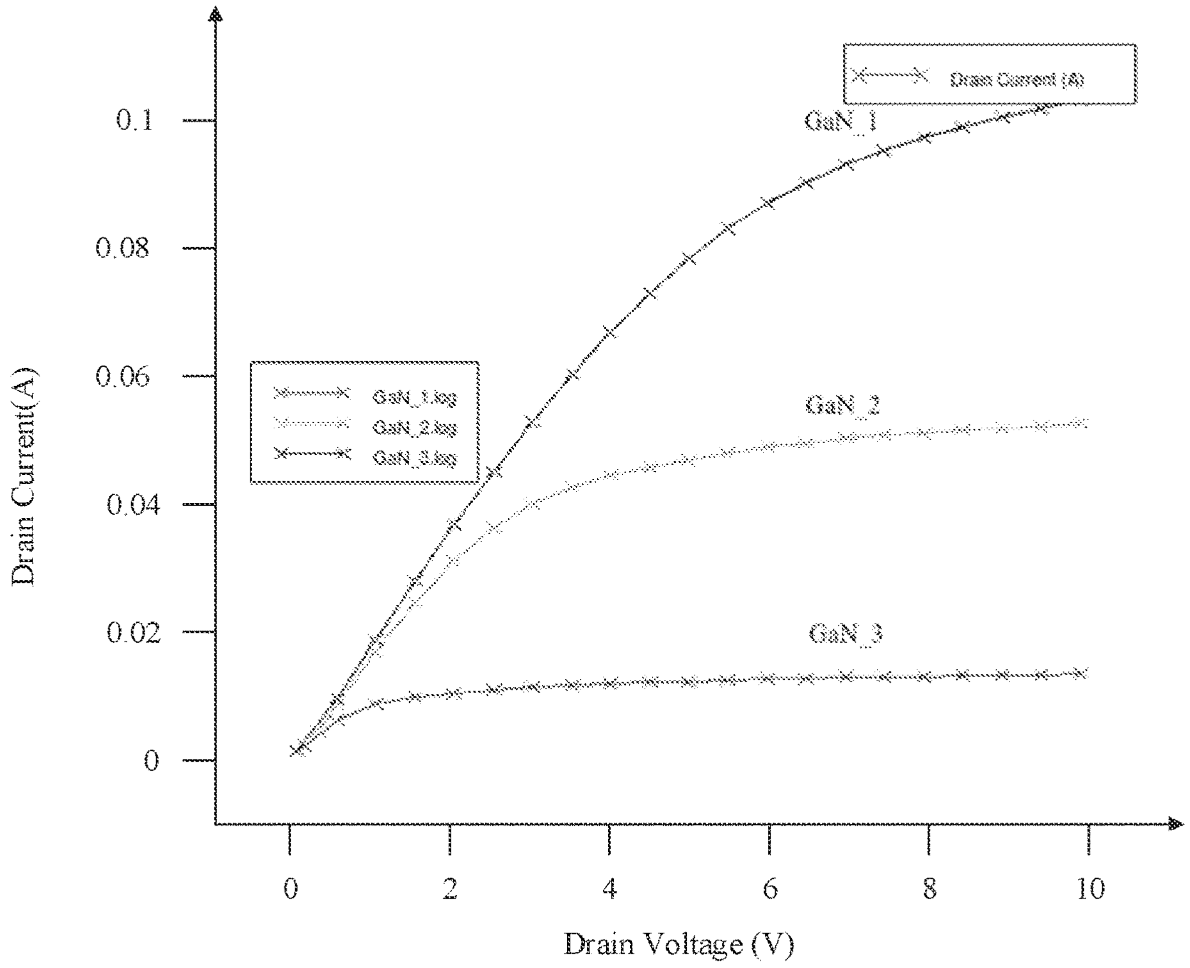
FIG. 4 is a graph showing an output characteristic curve of the AlGaN/GaN power HEMT device provided in Embodiment 1 of the present disclosure.

FIG. 4 is a graph showing an output characteristic curve of the AlGaN/GaN power HEMT device provided in the present embodiment. The output characteristic curve can be understood as the voltage-current characteristic of the drain, i.e. the variation of the drain current $I_D$ versus the variation of drain voltage $V_{DS}$. As shown in FIG. 4, the device is divided into a linear region, a non-linear region, and a saturation region, and a series of output curves can be obtained by changing the gate voltage, thereby extracting parameters such as the on-resistance RON of the device. In FIG. 4, GaN_1, GaN_2, and GaN_3 are output curves at different saturation currents (0.1/0.05/0.01 A) obtained by changing different gate voltages (8/9/10 V).

The gate-source voltage of the AlGaN/GaN power HEMT device provided in the present embodiment is allowed to vary in a small range and has a low maximum on-resistance, forming a low thermal resistance, and therefore, is suitable for a high-temperature environment. When the gate-source voltage is 0 and the transistor is turned on in the reverse direction, the forward source-drain voltage drop of the AlGaN/GaN power HEMT device is larger than that of the silicon-based MOSFET transistor. In applications of LCC resonant converters, the AlGaN/GaN power HEMT device have lower transistor loss than the silicon-based MOSFET transistor.

Embodiment 2

Referring to FIGS. 5 to 8, this embodiment provides a method for manufacturing an AlGaN/GaN power HEMT device, including the following steps, 1) An n-type GaN substrate 109 is provided;
2) A first p-type GaN layer 108, an AlGaN layer 107, and a hole-injection type PN junction layer 111 are sequentially formed from bottom to top above the n-type GaN substrate 109;
3) A gate structure 112 passing through the hole-injection type PN junction layer 111, the AlGaN layer 107, and the first p-type GaN layer 108, and stopped in the n-type GaN substrate 109 is formed; the gate structure 112 includes a gate metal aluminum layer 102 and a gate silicon dioxide layer 101 formed on sidewalls of and below the gate metal aluminum layer 102; the hole-injection type PN junction layer 111 includes a second p-type GaN layer 105 and a second n-type GaN layer 106 distributed in a horizontal direction, and the second n-type GaN layer 106 is located at a side close to the gate structure 112.

Figure 5:
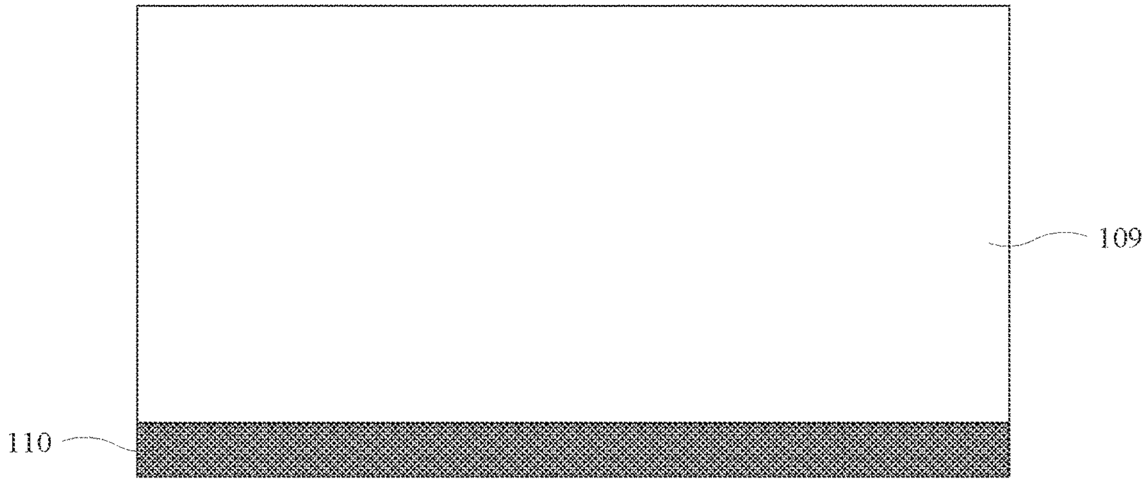
FIG. 5 is a schematic diagram of an n-type GaN substrate provided in Embodiment 2 of the present disclosure.

In step 1), as shown in FIG. 5, an n-type GaN substrate 109 is provided. In the preferred example, a first n-type GaN layer 110 is formed below the n-type GaN substrate 109. The first n-type GaN layer 110 is led out as the drain D of the AlGaN/GaN-power HEMT device. The first n-type GaN layer 110 has a higher doping concentration than the n-type GaN substrate 109. The n-type GaN substrate 109 and the first n-type GaN layer 110 may be formed by being successively epitaxially grown on an epitaxial substrate.

Figure 6:
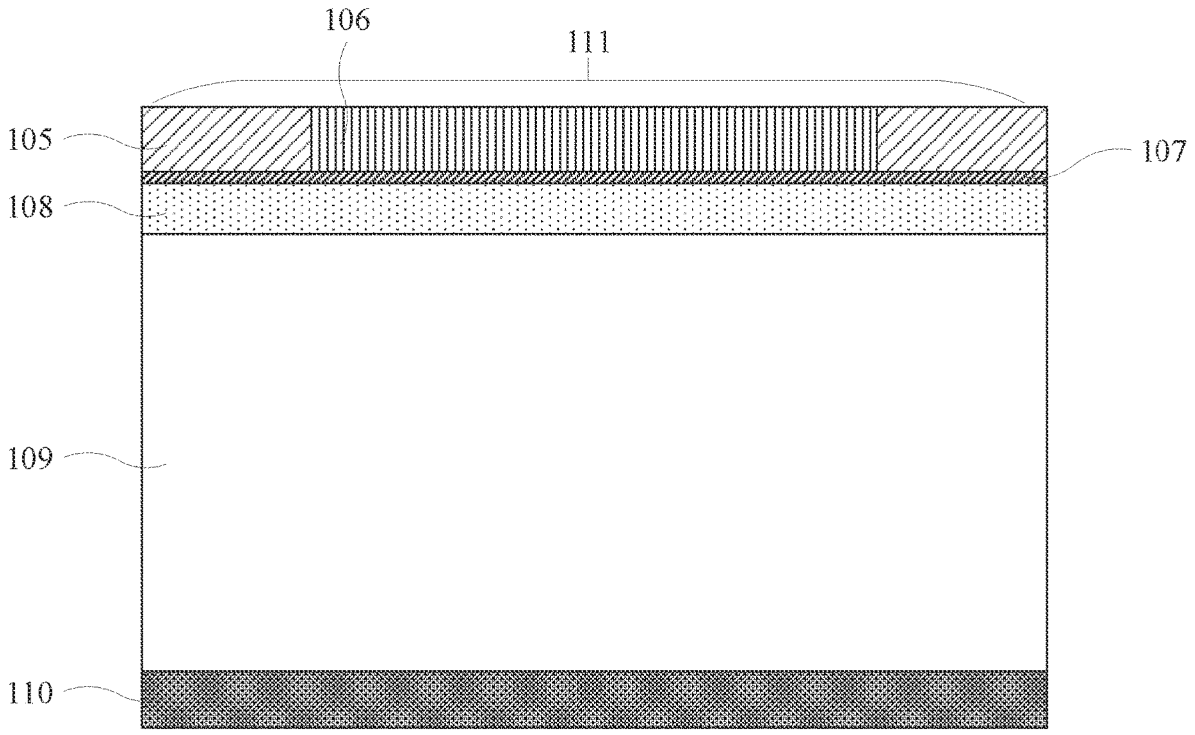
FIG. 6 is a schematic diagram in which a first p-type GaN layer, an AlGaN layer, and a hole-injection type PN junction layer are sequentially formed from bottom to top above an n-type GaN substrate according to Embodiment 2 of the present disclosure.

In step 2), as shown in FIG. 6, the first p-type GaN layer 108, the AlGaN layer 107, and the hole-injection type PN junction layer 111 are sequentially formed from bottom to top above the n-type GaN substrate 109. The hole-injection type PN junction layer 111 includes a second p-type GaN layer 105 and a second n-type GaN layer 106 distributed in a horizontal direction. The second n-type GaN layer 106 is located at a side close to a subsequently formed gate structure 112. The method of forming the first p-type GaN layer 108, the AlGaN layer 107, and the hole-injection type PN junction layer 111 includes epitaxially growing a layer of a desired material, and then obtaining a desired doping concentration by diffusion or ion implantation. The boundary between the second p-type GaN layer 105 and the second n-type GaN layer 106 may be defined by photolithography, and a GaN layer of the opposite doping type may be obtained by ion implantation of the p-type GaN layer or the n-type GaN layer.

Figure 7:
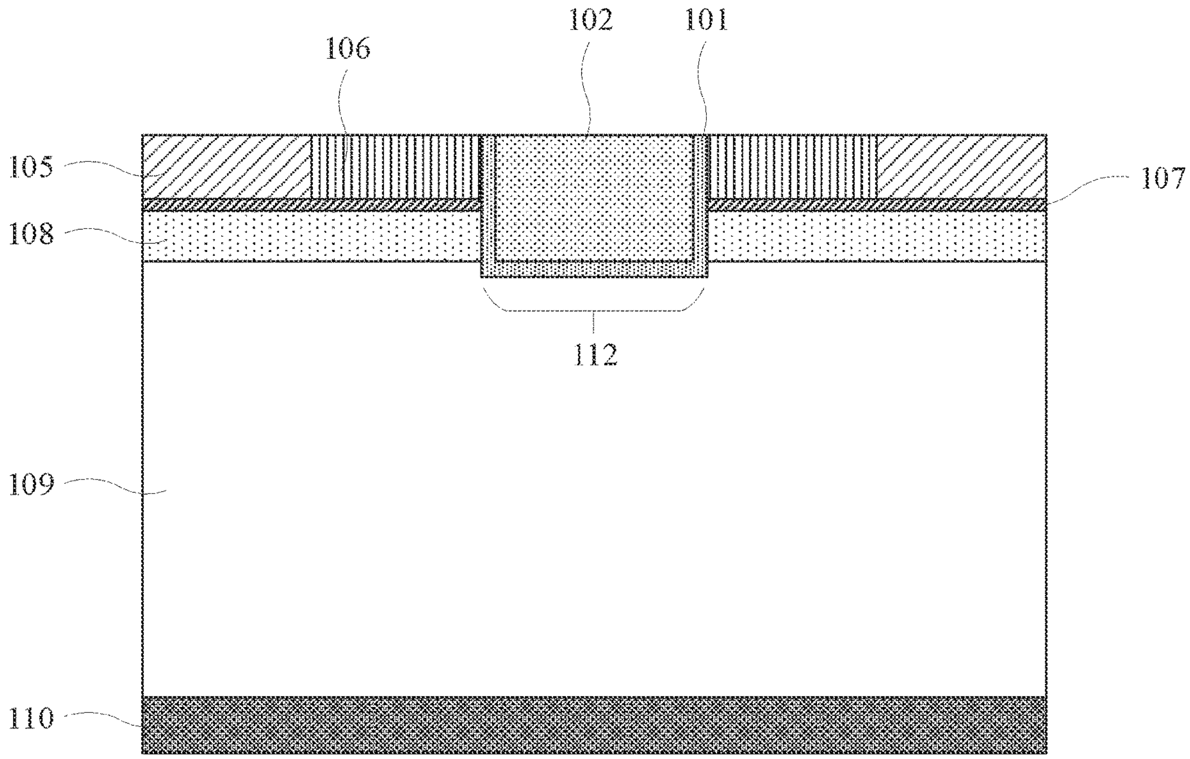
FIG. 7 is a schematic diagram of forming a gate structure in Embodiment 2 of the present disclosure.

In step 3), as shown in FIG. 7, a gate structure 112 passing through the hole-injection type PN junction layer 111, the AlGaN layer 107, and the first p-type GaN layer 108, and stopped in the n-type GaN substrate 109 is formed, and the gate structure 112 includes a gate metal aluminum layer 102 and a gate silicon dioxide layer 101 formed on sidewalls of and below the gate metal aluminum layer 102.

Figure 8:
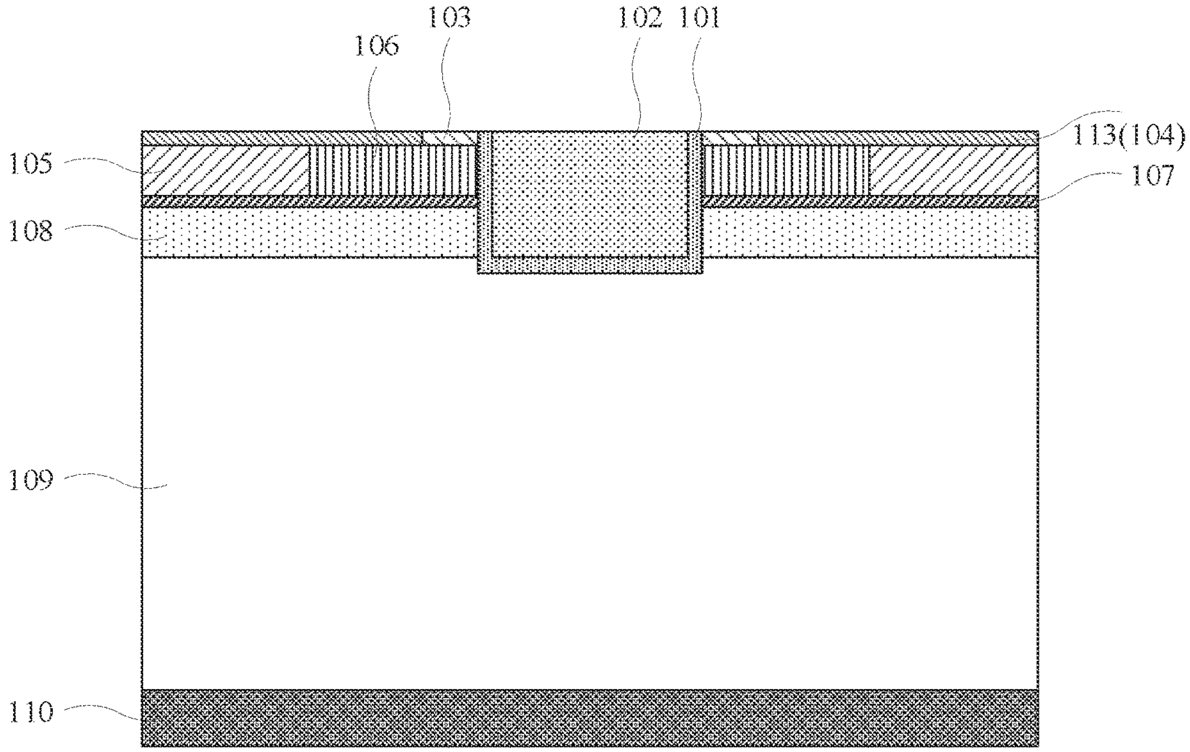
FIG. 8 is a schematic diagram of forming a source metal layer and a metal aluminum layer in Embodiment 2 of the present disclosure.

As an example, as shown in FIG. 8, the method for manufacturing the AlGaN/GaN power HEMT device further includes a step of forming a source metal layer 113 above the hole-injection type PN junction layer 111. In a preferred example, the source metal layer 113 is a metal gold layer 104 which is led out as the source S of the AlGaN/GaN power HEMT device. As an example, as shown in FIG. 8, the method for manufacturing the AlGaN/GaN power HEMT device further includes a step of forming a metal aluminum layer 103 above the hole-injection type PN junction layer 111; the metal gold layer 104 and the metal aluminum layer 103 are distributed in a horizontal direction, and the metal aluminum layer 103 is located at a side close to the gate structure 112. The interface between the metal aluminum layer 103 and the metal gold layer 104 is located above the second n-type GaN layer 106. The process of forming the source metal layer 113 includes, but is not limited to, a PVD process.

In a preferred example, in the present embodiment, the n-type GaN substrate 109 has a thickness of 8 μm and a doping concentration thereof is $2\times10^{15}$ $cm^{-3}$. The first p-type GaN layer 108 preferably has a thickness of 1 μm and a doping concentration thereof is $5\times10^{16}$ $cm^{-3}$. The AlGaN layer 107 has a thickness of 0.1 μm and a doping concentration thereof is $2\times10^{18}$ $cm^{-3}$. The hole-injection type PN junction layer 11 has a thickness 1 μm, that is, both the second p-type GaN layer 105 and the second n-type GaN layer 106 have a thickness of 1 μm. The doping concentration of the second p-type GaN layer 105 is $4\times10^{17}$ $cm^{-3}$, and the doping concentration of the second n-type GaN layer 106 is $2\times10^{18}$ $cm^{-3}$. The gate metal aluminum layer 102 has a thickness of 2.2 μm, and the gate silicon dioxide layer 101 has a thickness of 2.3 μm. The first n-type GaN layer 110 has a thickness of 1 μm and a doping concentration thereof is $2\times10^{18}$ $cm^{-3}$. The thickness of the source metal layer 113 is 0.1 μm, that is, the metal gold layer 104 has a thickness of 0.1 μm. The metal aluminum layer 103 has a thickness of 0.1 μm. The AlGaN/GaN power HEMT device designed as described above can optimize the drift region, change the electric field distribution in the vicinity of the trench gate structure, alleviate the electric field concentration phenomenon, improve the breakdown characteristic of the device, and improve an optimal value of the device.

In view of the foregoing, the present disclosure provides an AlGaN/GaN power HEMT device and a method for manufacturing the same. The AlGaN/GaN power HEMT device includes an n-type GaN substrate; a first p-type GaN layer formed above the n-type GaN substrate; an AlGaN layer formed above the first p-type GaN layer; a hole-injection type PN junction layer formed above the AlGaN layer; a gate structure passing through the hole-injection type PN junction layer, the AlGaN layer, and the first p-type GaN layer, and stopped in the n-type GaN substrate, the gate structure including a gate metal aluminum layer and a gate silicon dioxide layer formed on sidewalls of and below the gate metal aluminum layer. The hole-injection type PN junction layer includes a second p-type GaN layer and a second n-type GaN layer distributed in a horizontal direction. The second n-type GaN layer is located at a side close to the gate structure, and the gate metal aluminum layer 102 is led out as a gate. Compared with a conventional U-type GaN MOS transistor, the AlGaN/GaN power HEMT device provided by the present disclosure introduces a novel structure design, in which a channel structure is designed in a longitudinal direction to change an electric field distribution in the vicinity of a trench gate structure, thereby effectively relieving electric field concentration phenomenon, and further improving breakdown voltage and withstand voltage of the HEMT device.

The above examples merely illustrate the principles of the disclosure and its efficacy, and are not intended to limit the disclosure. Any person skilled in the art may modify or alter the above-described embodiments without departing from the spirit and scope of the present disclosure. Accordingly, it is intended that all equivalent modifications or changes which persons skill in the art, without departing from the spirit and technical spirit of the disclosure, will achieve will be encompassed by the appended claims.

What is claimed is:

1. An AlGaN/GaN power high electron mobility transistor (HEMT) device, comprising:

an n-type GaN substrate;

a first p-type GaN layer formed above the n-type GaN substrate;

an AlGaN layer formed above the first p-type GaN layer;

a hole-injection type PN junction layer formed on the AlGaN layer;

a gate structure passing through the hole-injection type PN junction layer, the AlGaN layer, and the first p-type GaN layer, and stopped in the n-type GaN substrate, the gate structure comprising a gate metal aluminum layer and a gate silicon dioxide layer formed on sidewalls of and below the gate metal aluminum layer; the hole-injection type PN junction layer comprising a second p-type GaN layer and a second n-type GaN layer distributed in a horizontal direction, the second n-type GaN layer being located at a side close to the gate structure.

2. The AlGaN/GaN power HEMT device according to claim 1, wherein the n-type GaN substrate has a thickness in a range of 5-10 μm, and a doping concentration of the n-type GaN substrate is in a range of $1\times10^{15}$-$5\times10^{15}$ $cm^{-3}$; the first p-type GaN layer has a thickness in a range of 0.5-1.5 μm, and a doping concentration of the first p-type GaN layer is in a range of $1\times10^{16}$-$1\times10^{17}$ $cm^{-3}$; the AlGaN layer has a thickness in a range of 0.05-0.15 μm, and a doping concentration of the AlGaN layer is in a range of $2\times10^{18}$-$5\times10^{18}$ $cm^{-3}$; the hole-injection type PN junction layer has a thickness in a range of 0.5-1.5 μm, a doping concentration of the second p-type GaN layer is in a range of $1\times10^{17}$-$1\times10^{18}$ $cm^{-3}$, and a doping concentration of the second n-type GaN layer is in a range of $1\times10^{18}$-$1\times10^{19}$ $cm^{-3}$; the gate metal aluminum layer has a thickness in a range of 0.5-5 μm, and the gate silicon dioxide layer has a thickness in the range of 0.5-5 μm.

3. The AlGaN/GaN power HEMT device according to claim 2, wherein the n-type GaN substrate has the thickness of 8 μm, and the doping concentration of the n-type GaN substrate is $2\times10^{15}$ $cm^{-3}$; the first p-type GaN layer has the thickness of 1 μm, and the doping concentration of the first p-type GaN layer is $5\times10^{16}$ $cm^{-3}$; the AlGaN layer has the thickness of 0.1 μm, and the doping concentration of the AlGaN layer is $2\times10^{18}$ $cm^{-3}$; the hole-injection type PN junction layer has the thickness of 1 μm, each of the second p-type GaN layer and the second n-type GaN layer has a thickness of 1 μm, the doping concentration of the second p-type GaN layer is $4\times10^{17}$ $cm^{-3}$, and the doping concentration of the second n-type GaN layer is $2\times10^{18}$ $cm^{-3}$; the gate metal aluminum layer has the thickness of 2.2 μm, and the gate silicon dioxide layer has the thickness of 2.3 μm.

4. The AlGaN/GaN power HEMT device according to claim 1, further comprising a first n-type GaN layer formed below the n-type GaN substrate, the first n-type GaN layer being led out as a drain of the AlGaN/GaN power HEMT device.

5. The AlGaN/GaN power HEMT device according to claim 4, wherein the first n-type GaN layer has a thickness in a range of 0.5-1.5 μm and a doping concentration of the first n-type GaN layer is in a range of $1\times10^{18}$-$5\times10^{18}$ $cm^{-3}$.

6. The AlGaN/GaN power HEMT device according to claim 5, wherein the first n-type GaN layer has the thickness of 1 μm, and the doping concentration of the first n-type GaN layer is $2\times10^{18}$ $cm^{-3}$.

7. The AlGaN/GaN power HEMT device of claim 1, further comprising a source metal layer formed above the hole-injection type PN junction layer.

8. The AlGaN/GaN power HEMT device of claim 7, wherein the source metal layer has a thickness in a range of 0.05-0.15 μm.

9. The AlGaN/GaN power HEMT device of claim 7, wherein the source metal layer comprises a metal gold layer, the metal gold layer being led out as a source of the AlGaN/GaN power HEMT device; the AlGaN/GaN power HEMT device further comprises a metal aluminum layer formed above the hole-injection type PN junction layer, the metal aluminum layer and the metal gold layer are distributed in a horizontal direction, and the metal aluminum layer is located at a side close to the gate structure.

10. The AlGaN/GaN power HEMT device of claim 9, wherein each of the metal aluminum layer and the metal gold layer has a thickness of 0.1 μm.

11. The AlGaN/GaN power HEMT device of claim 9, wherein an interface between the metal aluminum layer and the metal gold layer is located above the second n-type GaN layer.

12. A method for manufacturing an AlGaN/GaN power high electron mobility transistor (HEMT) device, comprising the steps of:

providing an n-type GaN substrate;

sequentially forming a first p-type GaN layer, an AlGaN layer, and a hole-injection type PN junction layer from bottom to top above the n-type GaN substrate;

forming a gate structure passing through the hole-injection type PN junction layer, the AlGaN layer, and the first p-type GaN layer, and stopped in the n-type GaN substrate, the gate structure comprising a gate metal aluminum layer and a gate silicon dioxide layer formed on sidewalls of and below the gate metal aluminum layer, the hole-injection type PN junction layer comprising a second p-type GaN layer and a second n-type GaN layer distributed in a horizontal direction, the second n-type GaN layer being located at a side close to the gate structure.

13. The method for manufacturing the AlGaN/GaN HEMT device of claim 12, further comprising the step of forming a first n-type GaN layer below the n-type GaN substrate, the first n-type GaN layer being led out as a drain of the AlGaN/GaN-power HEMT device.

14. The method for manufacturing the AlGaN/GaN HEMT device of claim 12, further comprising the step of forming a source metal layer above the hole-injection type PN junction layer, the source metal layer comprising a metal gold layer, the metal gold layer being led out as a source of the AlGaN/GaN power HEMT device; wherein the method for manufacturing the AlGaN/GaN power HEMT device further comprises the step of forming a metal aluminum layer above the hole-injection type PN junction layer, the metal aluminum layer and the metal gold layer being distributed in a horizontal direction, and the metal aluminum layer being located at a side close to the gate structure.

15. The method for manufacturing the AlGaN/GaN HEMT device of claim 14, wherein an interface between the metal aluminum layer and the metal gold layer is located above the second n-type GaN layer.

* * * * *